United States Patent [19]

Kamins et al.

[11] Patent Number: 5,202,284
[45] Date of Patent: Apr. 13, 1993

[54] SELECTIVE AND NON-SELECTIVE DEPOSITION OF $SI_{1-x}GE_x$ ON A SI SUBSRATE THAT IS PARTIALLY MASKED WITH $SIO_2$

[75] Inventors: Theodore I. Kamins, Palo Alto; David B. Noble, Sunnyvale; Judy L. Hoyt, Palo Alto; James F. Gibbons, Palo Alto; Martin P. Scott, San Francisco, all of Calif.

[73] Assignee: Hewlett-Packard Company, Palo Alto, Calif.

[21] Appl. No.: 444,464

[22] Filed: Dec. 1, 1989

[51] Int. Cl.$^5$ ................... H01L 21/20; H01L 21/205
[52] U.S. Cl. ................... 437/89; 148/DIG. 26; 437/99; 437/106
[58] Field of Search ............ 148/DIG. 26, 29, 50, 148/58, 59, 72, 97, 106, 169, 33, 33.1, 33.2; 156/610–614; 427/248.1, 252; 437/81, 62, 83, 89, 90, 99, 105, 106, 108, 112, 126, 132, 962, 978, 970, 973, 234

[56] References Cited

U.S. PATENT DOCUMENTS

| | | | |
|---|---|---|---|
| 4,274,891 | 6/1981 | Silvestri et al. | 437/99 |
| 4,529,455 | 7/1985 | Bean et al. | 156/610 |
| 4,579,621 | 4/1986 | Shiro Hine . | |
| 4,727,047 | 2/1988 | Bozler et al. | 437/89 |
| 4,786,615 | 11/1988 | Liaw et al. | 437/90 |
| 4,876,210 | 10/1989 | Barnett et al. | 437/132 |
| 4,910,164 | 3/1990 | Shichijo | 437/99 |
| 4,966,861 | 10/1990 | Mieno et al. | 437/99 |

FOREIGN PATENT DOCUMENTS

| | | | |
|---|---|---|---|
| 375965 | 11/1989 | European Pat. Off. . | |
| 0087339 | 7/1981 | Japan | 437/89 |
| 0005644 | 1/1984 | Japan | 437/89 |
| 0147471 | 6/1984 | Japan . | |
| 0134819 | 9/1984 | Japan | 437/90 |
| 0222923 | 12/1984 | Japan | 437/89 |
| 0057964 | 4/1985 | Japan | 437/89 |
| 0060716 | 4/1985 | Japan | 437/89 |
| 0193324 | 10/1985 | Japan | 437/89 |
| 0257541 | 12/1985 | Japan | 437/90 |
| 0019118 | 1/1986 | Japan | 437/90 |
| 0054740 | 3/1988 | Japan | 437/90 |
| 0058921 | 3/1988 | Japan | 437/89 |
| 0191412 | 8/1989 | Japan | 437/90 |

OTHER PUBLICATIONS

IBM Technical Disclosure Bulletin. vol. 31, No. 2, 2 Jul. 1988, New York pp. 205–207; "Self–Aligned Mesa Transistor".

IEEE Transactions on Electron Devices. vol. 36, No. 10, Oct. 1989, New York, pp. 2043–2064; S. S. Iyer et al.: "Heterojunction Bipolor Transistor Using Si–Ge Alloys", p. 2054, column 1, line 38–P. 2055, column 1, line 13; FIG. 17.

Kasai, Naoki; "½-um CMOS Isolation Technique Using Selective Epitaxy", IEEE Transactions on Electron Devices, vol. ED-34, No. 6, Jun. 1987, pp. 1331–1336.

Yonehara, T. et al., "Selective Growth of Nuclei on Amorphous Substrates", 19th Conference on Solid State Devices and Materials, Tokyo, 1987, pp. 191–194.

Tatsumi, Toru, et al. "Si/GE Si/Si Heterojunction Bipolar Transistor Made with Si Molecular Beam Epitaxy", Appl. Phys. Lett. 52 No. 11, pp. 895–897.

Ghandhi, *VLSI Fabrication Principles*, John Wiley & Sons, 1983, pp. 542–548.

Endo et al., "Novel Device Isolation Technology with Selective Epitaxial Growth", IEEE Trans. Electr. Devices, vol. ED-31, No. 9, Sep. 1984 pp. 1283–1288.

Dumin, "Selective Epitaxy Using Silane and Germane", J. Anyl. Growth, vol. 8, 1971, pp. 33–36.

*Primary Examiner*—Mary Wilczewski

[57] ABSTRACT

Several methods are disclosed for minimizing the number of defects or misfit locations in a SiGe layer selectively or non-selectively deposited on a partially oxide masked Si substrate.

5 Claims, 1 Drawing Sheet

SELECTIVE AND NON-SELECTIVE DEPOSITION OF $SI_{1-x}GE_x$ ON A SI SUBSRATE THAT IS PARTIALLY MASKED WITH $SIO_2$

The U.S. Government has rights in the invention disclosed and claimed herein pursuant to U.S. Army Research Office Contract No. DAAL003-88-K-0020.

BACKGROUND OF THE INVENTION

The present invention relates to the selective and non-selective deposition of SiGe on a Si substrate and how it is affected by the surface characteristics of the surface on which it is deposited. The selective and non-selective deposition of Si on a Si substrate is well-known from published reports in the literature, as is the deposition of SiGe films on a completely exposed Si substrate. However, prior to the experiments of the present inventors, little was know about the selective and non-selective deposition of SiGe on a Si substrate that is partially masked with $SiO_2$.

SUMMARY OF THE INVENTION

In accordance with the preferred embodiments of the present invention there are shown several methods for the deposition of a layer of SiGe on a Si substrate that is partially covered with silicon dioxide so that the defects or the misfit dislocations in the SiGe layer are minimized. The first embodiment provides a method whereby the silicon dioxide layer is first hidden by covering that layer with either silicon nitride or polycrystalline silicon before depositing the SiGe layer on the exposed Si of the substrate and the hidden layer of the oxide to minimize defects in the SiGe layer.

The second embodiment yields a method that is also for minimizing defects in the SiGe layer. In this method a first $SiO_2$ layer is grown on the surface of the Si substrate which is then anisotropically dry etched to form windows through the first $SiO_2$ layer so that the sidewalls of the windows are substantially vertical and the Si surface of the substrate is exposed. Next, a thin second $SiO_2$ layer is formed on the first $SiO_2$ layer and at the bottom of the windows on the exposed Si of the substrate to repair the surfaces of the exposed silicon substrate damaged in the anisotropic etch. The second $SiO_2$ layer is wet etched from the bottom surface of the windows to expose the Si surface of the substrate. Then a SiGe layer is selectively deposited within the windows.

The third embodiment is also a method for minimizing the defects in the SiGe layer and this is accomplished by first growing a $SiO_2$ layer on the surface of the Si substrate, followed by masking for lithographically opening windows through the $SiO_2$ layer with the total area of all of the windows being maximized with respect to the total area of the $SiO_2$ to be left on a portion of the surface of the substrate. Those steps are followed by etching windows in the $SiO_2$ layer using the mask to expose the Si surface of the substrate through those windows, and then selectively depositing a SiGe layer within the windows.

Next, the fourth embodiment is a method for minimizing the misfit dislocations in the SiGe layer by first growing a $SiO_2$ layer on the surface of the Si substrate, then masking for lithographically opening windows through the $SiO_2$ layer with the Then the mask is used to etch windows in the $SiO_2$ layer to expose the Si surface of the substrate through those windows, and then selectively depositing a SiGe layer within the windows.

The fifth embodiment is a combination of the first and fourth embodiments to minimize the number of defects and misfit dislocations in the SiGe layer.

DESCRIPTION OF THE PREFERRED EMBODIMENT

Figure 1A:
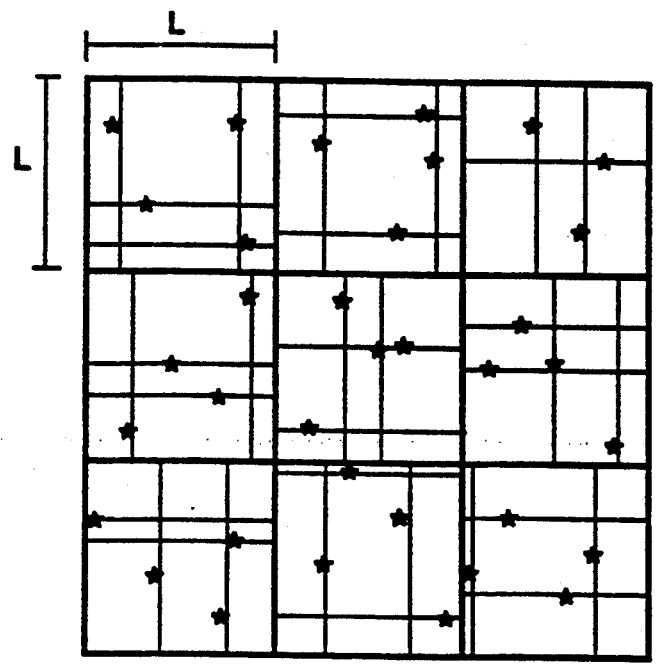
FIGS. 1a and 1b are schematic illustrations of the effect of growth areas on the formation of misfit dislocations in a SiGe layer.

Before discussing the experiments that lead to the present invention, some general discussion and definition of terms is needed. The selective process is one where the film only deposition one type of surface (e.g. exposed Si only). Conversely, a non-selective, or mixed, process is one where the deposition occurs over the entire surface, over all of the various surface characteristics. Epitaxial growth is said to be single crystalline since the crystal structure of an epitaxial layer has a single orientation, and a polycrystalline layer is so described because the crystal structure of that layer does not have a uniform crystalline orientation. Under suitably chosen deposition conditions, with Si, and as the experiments with SiGe films have shown, when the deposition is over a single-crystal layer the deposited layer will also be epitaxial, and over a polycrystalline layer or a non-crystalline layer (e.g. silicon oxide or silicon nitride) the deposited layer will be polycrystalline.

The experiments conducted by the present inventors included attempts to selectively and non-selectively deposit a SiGe film on various preprocessed Si wafers: a first wafer that was partially masked with silicon dioxide, a second wafer where the silicon dioxide mask was completely covered with a layer of silicon nitride on both its horizontal and vertical surfaces, and a third where the silicon dioxide mask was completely covered with a layer of polycrystalline Si on both its horizontal and vertical surfaces.

Each of these experiments was conducted with substantially the same reactor conditions, namely:
1) each wafer received a standard pre-clean at a pressure of 250 Torr in a $H_2$ atmosphere at 1200 degrees C. for 20 seconds (this is a very high temperature that would not be used in the manufacture of a semiconductor device).
2) for the selective deposition of epitaxial silicon, that layer is deposited in a reactor with a mixed gas flow of 20 cc/min flow of DCS (diclorosilane) and 5 liters/min of $H_2$ at a pressure of 6.4 Torr and a temperature of 1000 degrees C. for 3 min to deposit about 2500 A of Si.
3) for the selective deposition of the SiGe layer on each of the substrates the gas flow consisted of a mixed flow of 40 cc/min of DCS, 150 cc/min of 1% of germane (GeH4) mixed in hydrogen, and a carrier gas of $H_2$ at 5 liters/min, with a pressure of 6.4 Torr and 625 degrees C. for 25 mins. to yield an approximately 1000A thick layer of SiGe that is 21% Ge by atomic fraction.

In the first experiment a wafer that was mainly masked with silicon dioxide was placed in the reactor and an attempt was made to selectively deposit SiGe on the exposed Si. The result of that experiment was the selective deposition of SiGe on the exposed Si under conditions that are reasonably compatible with the deposition of SiGe at the usual temperatures at which deposition of SiGe occurs. It deposited on exposed Si and not on the oxide. However, there was a problem. It was discovered that as a result of a large fraction of the wafer being covered with $SiO_2$ there was an interaction between the depositing species and the oxide. That reaction caused many defects to form within the deposited SiGe layer that substantially extend through the thickness of the SiGe, i.e. over too large a region to make that type of deposition interesting for the production of a semiconductor device. On the other hand, when the wafer consists of mainly exposed Si and very little oxide, there were few defects extending through the thickness of the SiGe layer.

Selective deposition of SiGe in small areas changed the thickness at which misfit dislocations first formed when compared to growth in large areas. Few misfit dislocations were observed in a SiGe layer deposited in a small area at a thickness and Ge content for which many dislocations were observed in a large area.

The next experiment was to grow SiGe selectively with the masking oxide hidden. By doing so, the question sought to be answered was can the crystal defects discovered when the wafer has mainly exposed oxide be avoided and will other types of deposition occur.

Mentioned above, two different layers which cover the oxide were used in various experiments. In one the oxide is covered with a layer of silicon nitride, and in the other it is covered with polycrystalline Si.

Several interrelated things occurred. First, with poly Si it is expected that the deposition will be non-selective, with epitaxial SiGe on the exposed Si of the substrate and polycrystalline SiGe on the poly Si region over the oxide. That indeed was the result when poly Si was used. Unexpectedly with the nitride layer, similar behavior was observed. In that situation, poly SiGe was deposited on the exposed nitride and epitaxial SiGe on the exposed Si of the substrate without the defects observed through the thickness of the SiGe with the uncovered oxide.

Furthermore, conditions were found where Si could be deposited selectively on the exposed Si substrate without depositing it on the exposed nitride. Then subsequently the SiGe could be deposited non-selectively in the mixed form to get deposition as epitaxial SiGe on the first layer of exposed Si and as polycrystalline material on the exposed nitride.

The portion of the SiGe layer on top of the nitride layer was observed to be about as thick as the portion of the SiGe layer over the exposed Si. Additionally, the portion of the SiGe layer over the exposed Si layer was epitaxial and the portion of the SiGe layer over the nitride layer was polycrystalline.

There are many factors which determine whether the resulting deposition is selective or non-selective (mixed). First, we can examine the selective Si deposition. It is reasonably well known that selectivity of Si with respect to oxide is greater than with respect to nitride. It is easier to keep a deposition off oxide than it is off nitride when you are just depositing Si or tungsten, as two examples. Thus, the surface characteristics of the substrate is one consideration. Adjusting the chemistry of the gases is another consideration, i.e. the ratio of the Cl containing species to the Si or the Ge containing species is important. The more Cl, the more selective the deposition will be. To get less selective depositions you have to have less Cl. Time and temperature each also make a difference because they affect nucleation and the rate at which it progresses, as well as contributing to the presence of defects or the lack of same.

In the case of deposition when nitride is present, there are conditions where Si deposition will be selective and SiGe deposition is non-selective with only the temperature and gases since Si is deposited at a higher temperature than. For example, Si is usually deposited between 800 and 1000 degrees C., and SiGe is usually deposited between 600 and 700 degrees C. For SiGe if a lower temperature is used it is less likely that misfit dislocations will form in.

For the non-selective situation, the primary difference was that the flow rate of DCS is reduced by a factor of 2. A higher $H_2$ flow rate should remove the byproducts from the wafer more quickly, so we would expect a higher $H_2$ flow to increase the selectivity. A higher flow rate for the reactant gases, for a shorter period results in the deposition of the same thickness of depositing material, and with Si apparently helps selectivity.

For a higher flow of germane the deposition of SiGe will be less selective because depositing species is being added without the addition of more Cl. Thus, the germane flow rate can not be increased by more than a factor of 2 or 3 without getting into trouble with selectivity.

The temperature is constrained by other factors. The formation of misfit dislocations, for example, could dictate the upper temperature bound, and the lower temperature bound is dictated by deposition rate and a loss of crystallinity in the SiGe layer in both the selective and the mixed depositions, as it is in blanket deposition.

Generally pressure, a lower pressure, tends to promote selectivity, however, this interacts with many other variables; 5 or 10 Torr is a convenient pressure range. If a pressure closer to atmospheric pressure is used, selectivity becomes harder to obtain in the deposition of Si and deposits on the oxide form more readily.

Alternatively, HCl could be added to increase the selectivity, thus Cl species would be added without adding a depositing species. The amount of Cl present is a major factor as to the selectivity of the process.

One observation that was one of the motivations for these experiments was to see if in a small region we could grow thicker SiGe layers without the considerable numbers of the defects that occur when a comparable or thinner SiGe layer is deposited in a large area. That was found to be the case, i.e. that the thickness of SiGe to get a given defect density was much greater when the SiGe layer was deposited in a small area than when it was deposited in a large area.

In another experiment it was found that the defects in the SiGe layer could be reduced by growing a first $SiO_2$ layer, a field oxide layer, on the surface of the Si substrate, and then anisotropically dry etching (e.g. a plasma etch) the desired windows through the field oxide so that the side-walls of the windows are substantially vertical. When a dry etch is performed, the edges of the oxide are typically damaged the surface of the Si substrate is typically damaged. To repair that surface, a thin second layer of $SiO_2$ is formed on the surface of the field oxide and into the windows which is then wet etched (e.g. with a hydroflouric, HF, etch) from the bottom surface of the windows to expose the surface of the Si. A SiGe layer is then selectively deposited within the windows.

$Si_{1-x}Ge_x$ and Si layers have been grown selectively in the exposed Si regions on oxide-patterned <100>-oriented Si wafers using the chemical vapor deposition technique limited reaction processing. Misfit dislocation spacings at the heterointerface were measured using plan-view transmission electron microscopy in conjunction with a large-area thinning technique which allows for examination of 100-150 μm diameter areas. The dislocation density is reduced by at least a factor of 20 for small areas (lateral dimensions:tens of microns) bounded by oxide isolation when compared to adjacent large areas (millimeters) which are uninterrupted by the patterned oxide. The ability to selectively grow $Si_{1-x}Ge_x$ on patterned wafers and the area-dependent reduction in dislocation density in as-grown films may be important considerations for future device applications using $Si_{1-x}Ge_x$ strained layers.

Recently Fitzgerald, et al.[Journal of Applied Physics,65,2220,1989], in studying InGaAs/GaAs strained layers grown by molecular beam epitaxy, have shown that the misfit dislocation density formed during film growth is reduced when the growth area is reduced. As a result, films can be grown fully strained to much greater thicknesses on small areas than on large areas. The present inventors show that this phenomenon can be used to gain insight into the kinetics of misfit dislocation formation in strained layers. Similar area-dependent reduction in dislocation density was observed in $Si_{0.8}Ge_{0.2}$/Si strained layers grown by the chemical vapor deposition (CVD) technique limited reaction processing (LRP). In contrast to the work of Fitzgerald, et al., whose small areas were created by film deposition on mesas produced by etching trenches in the GaAs substrate, the small areas in this study were produced by the selective deposition of Si and $Si_{1-x}Ge_x$ in the exposed Si regions on oxide-patterned wafers. For a CVD technique, growth on mesa structures is probably not an effective means of limiting growth area since deposition is expected on the sides, as well as the tops, of the mesas.

The Si and $Si_{1-x}Ge_x$ films in this study were grown by LRP which is a CVD technique that employs rapid changes in wafer temperature to initiate and terminate film growth [Applied Physics Letters, 47,721, 1985]. Wafers with oxide patterns were prepared from <100>-oriented Si substrates covered with 3000 Å of thermal oxide. Selective growth of Si and SiGe was achieved using the same growth procedure reported in our previous work for blanket layers grown on unpatterned wafers [3rd Int. Sym. on Si MBE: Alternative Growth Methods, Strasbourg, France, May 30–June 2, 1989]. After a 1200 °C. hydrogen prebake for 30 seconds, a 1000 Å thick Si buffer layer was grown selectively at 1000° C. using dichlorosilane. This was followed by the in-situ deposition of a $Si_{0.8}Ge_{0.2}$ layer approximately 2000 Å thick at 625 °C. using dichlorosilane and germane. Both layers were grown using a hydrogen carrier gas at a pressure of about 6.5 torr. Layer thicknesses and compositions were measured with 2.2 Mev $^4He^+$ Rutherford Backscattering (RBS) and cross-section transmission electron microscopy (XTEM). The selective growth of pure Si and pure Ge layers using dichlorosilane and germane has been reported previously for a variety of growth temperatures and pressures. For SiGe deposition in the present study, no deposition was observed on the oxide by optical microscopy. In addition, X-ray analysis during plan-view transmission electron microscopy and Auger electron spectroscopy revealed no evidence of Ge on the oxidized portions of the samples. Undercutting of the oxide sidewalls and roughness at the oxide edges resulting from the 1200° C. $H_2$ prebake may play a role in the nucleation of misfit dislocations in the selective films.

Unlike the case of the InGaAs/GaAs layers mentioned earlier, the indirect bandgap of Si and $Si_{1-x}Ge_x$ precludes the use of cathodoluminescence to image misfit dislocations over large areas. It is therefore necessary to use another technique, such as electron beam induced current imaging (EBIC), X-ray topography or plan-view transmission electron microscopy (TEM). EBIC was judged unsuitable for these layers, since it has been shown that misfit dislocations in our films are only weakly electrically active and are very difficult to image using this technique. X-ray topography was also rejected because of the small growth areas involved and the presence of strain due to the oxide pattern. Thus, dislocation densities were measured using plan-view TEM and are the reciprocal of the average spacing between individual misfit dislocations. The dislocation spacings quoted below for the patterned wafer are average values from four TEM specimens with a total viewing area of approximately 200,000 μm² split about evenly between large and small areas. Electron-transparent areas (100-150 μm diameter) were produced with a combination of mechanical thinning and Ar ion milling employing the technique described by Madden [Journal of Electron Microscopy Tech., 11, 161, 1989]. The best samples were carefully milled to transparency without creating a hole. A collage of TEM micrographs taken in an area similar to that shown discussed above was made. This area is at the end of a set of oxide fingers spaced about 10 μm apart adjacent to a large open area approximately 1 mm in diameter. The misfit dislocation spacing in the large area was noted to vary from 0.25-1.0 μm, whereas the spacing in the small areas of the selective wafers is greater than 20 μm. The misfit spacing measured on an unpatterned Si control wafer (same buffer layer and 2000 Å thick SiGe film) was close to that measured in the large areas of the selective wafers, 0.5-1.0 μm. The misfit dislocations are seen to propagate from the large area into the small areas and the fingers. Threading dislocations connecting the misfit segments to the free surface were observed only at one or the other of the two sidewalls. This observation is consistent with the idea that these dislocations nucleated at one sidewall and propagated to the other.

An explanation of the mechanisms responsible for a reduction in misfit dislocation density in small growth areas is given below. The reader is referred to the work of Matthews et. al., [J. Appl. Phys. 41, 3800, 1970] and Fitzgerald et. al., et. seq. for a rigorous treatment. For this analysis it is assumed that misfit dislocation nucleation is dominated by sources which can be defined as localized defects with a fixed areal density; i.e., there is a fixed density of sources given by: N sources /cm². Threading dislocations from the substrate, dust particles, precipitates, and dislocation interactions are examples of such sources. Three interrelated factors are responsible for the observed area effect. First: in small areas, if the density of sources is low enough, it is possible to have areas with few active nucleation sources and thus few misfit dislocations. Second: The misfit lines generated by the fixed dislocations run to the edges of the area (mesa or oxide sidewall) and stop. Third: dislocation multiplication [Appl. Phys. 17, 85, 1978] is more likely to occur in large areas because more of the dislocation interactions that can lead to multiplication are likely in large areas than in small areas.

Figure 1B:
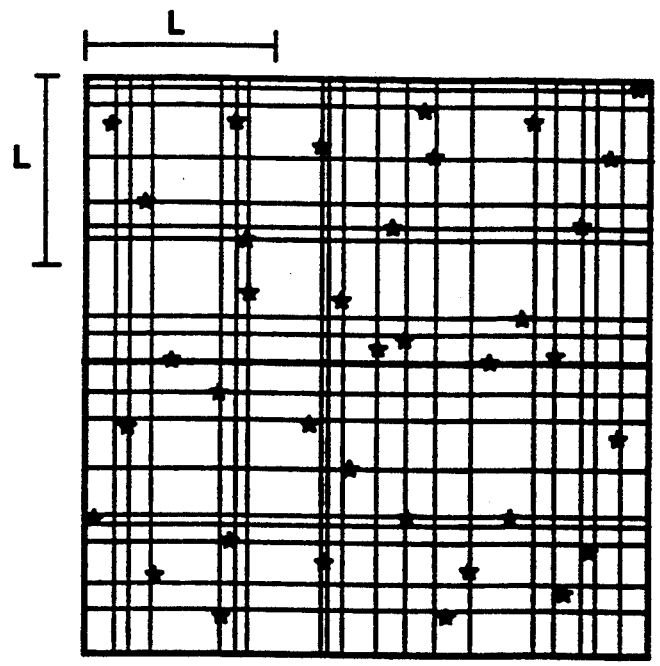

FIGS. 1a and 1b schematically illustrate the effect of growth area on the formation of misfit dislocations. Only the first and second factors mentioned above were considered in producing the schematics; dislocation multiplication is not necessary to produce an area effect. FIG. 1a shows an array of 9 square growth areas defined by oxide sidewalls (bold lines). Each area is $L^2$ in size for a total growth area of $9L^2$. Four nucleation sites (stars) are randomly placed in each small area, and one misfit dislocation segment is nucleated by each source. Two of the four misfit segments in each small area run in each of the two orthogonal <110> directions. The oxide sidewalls stop misfit segments from propagating into adjacent areas. The linear misfit dislocation density, $\rho$, is the inverse of the dislocation spacing, s, measured in each of the <110> directions. In this idealized situation the average dislocation spacing over all nine areas is the same as that in one area; $s=L/2$ and $\rho=1/s=2/L$. The situation represented in FIG. 1b is identical to that described for FIG. 1a except that the interior oxide sidewalls separating the small areas have been removed. This results in one large area $9L^2$ in size. The same dislocation sources can now produce misfit segments that are three times as long. The average dislocation spacing in FIG. 1b is L/6 and the linear dislocation density has increased by a factor of three over that in FIG. 1a. As shown by the detailed analysis of Fitzgerald et. al., et. seq., the linear misfit dislocation density is proportional to L, where L, the mean dislocation line length, is a function of the geometry of the area. If dislocation multiplication is considered, the area effect is expected to be more pronounced, and the linear dislocation density is no longer proportional to L. It should be possible to model homogeneous nucleation, which by definition is not associated with a localized defect, in a similar manner to that described above if the area density of nucleation events is low compared to the feature sizes of interest.

An area dependent reduction in dislocation density is evident in our $Si_{1-x}Ge_x$/Si films, yet there is no obvious dominant nucleation source. Since, <100>-oriented Si substrates are dislocation free, threading defects from the substrate are not responsible for the nucleation of misfit dislocations in these films. Even though there is evidence for heterogeneous nucleation of misfit dislocations associated with the oxide sidewalls, the fact that the unpatterned control wafer has a similar dislocation density to that observed in the large area on the patterned wafer suggests that another nucleation mechanism is dominant. Homogeneous surface half-loop nucleation is unlikely, since the strain in a commensurate $Si_{0.8}Ge_{0.2}$ alloy is only 0.9%. This value is well below the theoretical value of 2-6% strain thought to be necessary to initiate such events. Therefore, as yet unidentified nucleation processes, perhaps in combination with dislocation multiplication (via the Hagen-Strunk mechanism), are responsible for misfit dislocation formation in our $Si_{1-x}Ge_x$ films. Further experiments using oxide-patterned wafers with a variety of area sizes and geometries in combination with selective deposition should provide a means to study these phenomena in more detail in CVD-grown layers.

The selective deposition of Si and $Si_{0.8}Ge_{0.2}$ layers in the exposed Si regions on oxide-patterned <100>-oriented wafers using LRP has been demonstrated. A reduction in dislocation density is evident when growth takes place in small areas defined by the oxide pattern when compared to adjacent large areas. These results may be of practical importance for the production of $Si/Si_{1-x}Ge_x$ devices and of academic interest as a means to study misfit dislocation formation in CVD-grown strained layers.

What is claimed is:

1. A method of depositing a silicon-germanium layer on a partially oxide-masked silicon substrate, the method comprising:

growing a silicon dioxide layer on a silicon substrate;
   preparing a pattern of windows to be etched through the silicon dioxide layer wherein the total area of the windows to be etched is maximized with respect to the total area of the silicon dioxide layer that is not to be etched;
   etching windows through the silicon dioxide layer according to the pattern to expose the silicon substrate; and
   selectively depositing a silicon-germanium layer on the exposed substrate in the windows,
   whereby any defects in the silicon-germanium layer are minimized.

2. A method as in claim 1 wherein preparing a pattern comprises masking the silicon dioxide for photolithographic etching and etching windows comprises etching by means of the mask.

3. A method of depositing a thick silicon-germanium layer on a partially oxide-masked silicon substrate, the method comprising the steps of:

growing a silicon dioxide layer on a silicon substrate;
   preparing a pattern of a window to be etched through the silicon dioxide layer wherein the area of the window to be etched is determined according to the desired thickness of the silicon-germanium layer to be deposited in the window;
   etching a window through the silicon dioxide layer according to the pattern to expose the silicon substrate; and
   selectively depositing a silicon-germanium layer having said thickness and germanium content on the exposed substrate in the window,
   whereby any misfit dislocations in the silicon-germanium layer are minimized.

4. A method as in claim 3 wherein preparing a pattern comprises masking the silicon dioxide for photolithographic etching, and etching a window comprises etching by means of the mask.

5. A method of depositing a silicon-germanium layer on a partially oxide-masked silicon substrate, the method comprising:

growing a thick first silicon dioxide layer on a silicon substrate;
   anisotropically dry etching a window having substantially vertical side-walls through the first silicon dioxide layer to expose a portion of the substrate;
   forming a thin second silicon dioxide layer over the first silicon dioxide layer and over the exposed silicon substrate in the window, thereby removing any silicon damaged during the anisotropic dry etch;
   removing the second silicon dioxide layer from the window by wet etching to expose the silicon substrate; and
   selectively depositing a silicon-germanium layer on the exposed substrate in the window,
   whereby any defects in the silicon-germanium layer are minimized.

* * * * *

UNITED STATES PATENT AND TRADEMARK OFFICE
CERTIFICATE OF CORRECTION

PATENT NO. : 5,202,284
DATED : April 13, 1993
INVENTOR(S) : Theodore I. Kamins et al.

It is certified that error appears in the above-identified patent and that said Letters Patent is hereby corrected as shown below:

Column 1, line 67, "...SiO2 layer with the " should read
-- "...SiO2 layer with the area of window being minimized.";

Column 2, line 56, "... for the selective desposition" should read
--for the selective or non-selective deposition --;

Column 4, line 8, "... and gases since Si is deposited at a higher temperature than. For ..." should read "... temperature and gases being different. For, ...".

Signed and Sealed this

First Day of March, 1994

Attest:

BRUCE LEHMAN

Attesting Officer          Commissioner of Patents and Trademarks